United States Patent [19]

Jeffcoat

[11] 4,079,250

[45] Mar. 14, 1978

[54] PROGRAMMABLE VOLTAGE SENSING CIRCUIT

[76] Inventor: James M. Jeffcoat, P.O. Box 294, Swansea, S.C. 29160

[21] Appl. No.: 751,216

[22] Filed: Dec. 16, 1976

[51] Int. Cl.² .............................................. E04G 17/00
[52] U.S. Cl. ................................ 250/209; 250/214 A; 328/147; 328/148
[58] Field of Search ................... G06G/7/14; 242/57; 250/209, 214 A; 328/146, 147, 148

[56] References Cited

U.S. PATENT DOCUMENTS

| | | | |
|---|---|---|---|
| 3,931,513 | 1/1976 | Germain | 250/209 X |
| 3,943,367 | 3/1976 | Baker | 250/209 X |

*Primary Examiner*—Lawrence J. Dahl
*Attorney, Agent, or Firm*—Cushman, Darby & Cushman

[57] ABSTRACT

A simple, reliable and sensitive electrical circuit for detecting when a first input exceeds a second input and vice versa and producing corresponding signals at first and second outputs comprising first and second operational amplifiers each having its negative input connected to its output and its positive input serving as a circuit input to function as a voltage follower, first and second comparator circuits with the positive input to the first comparator being directly connected to the output of the first amplifier and the negative input to the output of the second amplifier via voltage dividing resistors so that the output thereof goes to zero when the output of the first amplifier drops below the divided output of the second and with the second comparator similarly connected so that the output thereof goes to zero when the output of the second amplifier drops below the divided output of the first amplifier. The circuit finds particular utility in a system for detecting yarn or thread breakage or for counting.

4 Claims, 3 Drawing Figures

PROGRAMMABLE VOLTAGE SENSING CIRCUIT

BRIEF DESCRIPTION OF THE PRIOR ART AND SUMMARY OF THE INVENTION

The invention relates to a simple and sensitive circuit for detecting voltage changes and particularly to a circuit and a system for accurately detecting thread or yarn breakage or for counting threads or other objects.

Many electrical situations exist in which it is necessary to accurately and sensitively produce output signals which reflect the difference in magnitude between two input signals. One such situation is for detecting and indicating the breakage of a strand of thread or yarn. Such breakage today is often detected by suspending metal wires or the like from the strands so that the wires fall onto a grounded surface to produce an indication signal. These systems are complicated and attempts have been made to replace them with optical devices whereby the passage of a broken thread through an optical path between a source and a detector is used to produce a signal which indicates that the thread has been broken. An optical system of this type not only requires minimum installation time, but is theoretically simple and sensitive. However, much difficulty has been encountered in guarding against false signals from such systems. To eliminate such signals, the present invention employs two or more light sensors arranged so that the thread sequentially breaks each of the optical paths producing at least two signals in succession which are then processed to provide an appropriate control function for actuating conventional output circuitry, such as for counting or alarm indication.

Another difficulty with such systems is that a suitable electrical circuit for simply, reliably and sensitively receiving the signals from the sensors and producing appropriate outputs has not hitherto existed. The available circuits lack stability, are overly complex, tend to be inaccurate, and require skilled maintenance personnel to install and maintain. Such prior art circuits generally require input filtering to reject minor signal fluctuations, electrical noise and multiple counts in a counter circuit which limits sensitivity and speed. Comparison circuits now available, and which could be used for this purpose, generally require the reference voltage to be set and frequently adjusted to compensate for changes in lamp intensity, alignment, temperature drift and ambient light changes. Such prior art designs limit the sensitivity to a general lack of stability.

The present invention relates to a circuit which is extremely simple and which fulfills this need, particularly with respect to processing signals derived from sensors which detect movement of a thread or other object past the sensors, breaking in sequence two optical paths.

The present circuit can be simply and easily programmed to respond to any given level of voltage fluctuation. The individual elements of which it is comprised are simple, inexpensive and readily available commercially. The output is accurate and reliable.

More particularly, the unique circuit of the present invention includes first and second operational amplifiers which are connected as voltage followers having a high input impedance and a low output impedance. The two voltages to be compared, e.g., from photoresistive sensors, are respectively applied to the positive inputs to the first and second operational amplifiers with the negative input of each amplifier being conventionally connected to its output to form the follower circuit. The output of the first operational amplifier is divided by a variable or fixed resistive divider and also applied directly to the positive input to a first comparator which may be an operational amplifier as well. The divided voltage is applied to the negative input to a second comparator. The output of the second operational amplifier connected as a voltage follower is similarly divided and the divided voltage supplied to the negative input to the first comparator. Similarly, the output of the second operational amplifier is directly applied to the positive input to the second comparator. The respective outputs of the first and second comparators thus provide the outputs of the circuit which can be applied to digital or other counting arrangements and to display devices particularly when the circuit is used in a system for detecting the breakage of thread or yarn strands.

When the input voltage applied to the first amplifier decreases with respect to the voltage applied to the second amplifier, which may be a reference voltage or ground, by more than a given percentage as set by selecting the resistance connecting the output of the second amplifier to the negative input to the first comparator, then the output of that first comparator goes to zero and/or ground producing an easily differentiable output signal. Similarly, when the positive input to the first operational amplifier rises with respect to the positive input to the second operational amplifier by more than a given percentage as determined by the resistive settings connecting the output of the first amplifier to the negative input to the second comparator, then the output of the second comparator similarly goes to zero producing a second output signal which can be applied to a digital counter display or other structure.

Many other objects and purposes of the invention will be clear from the following detailed description of the drawings.

DETAILED DESCRIPTION OF THE DRAWINGS

Figure 1:
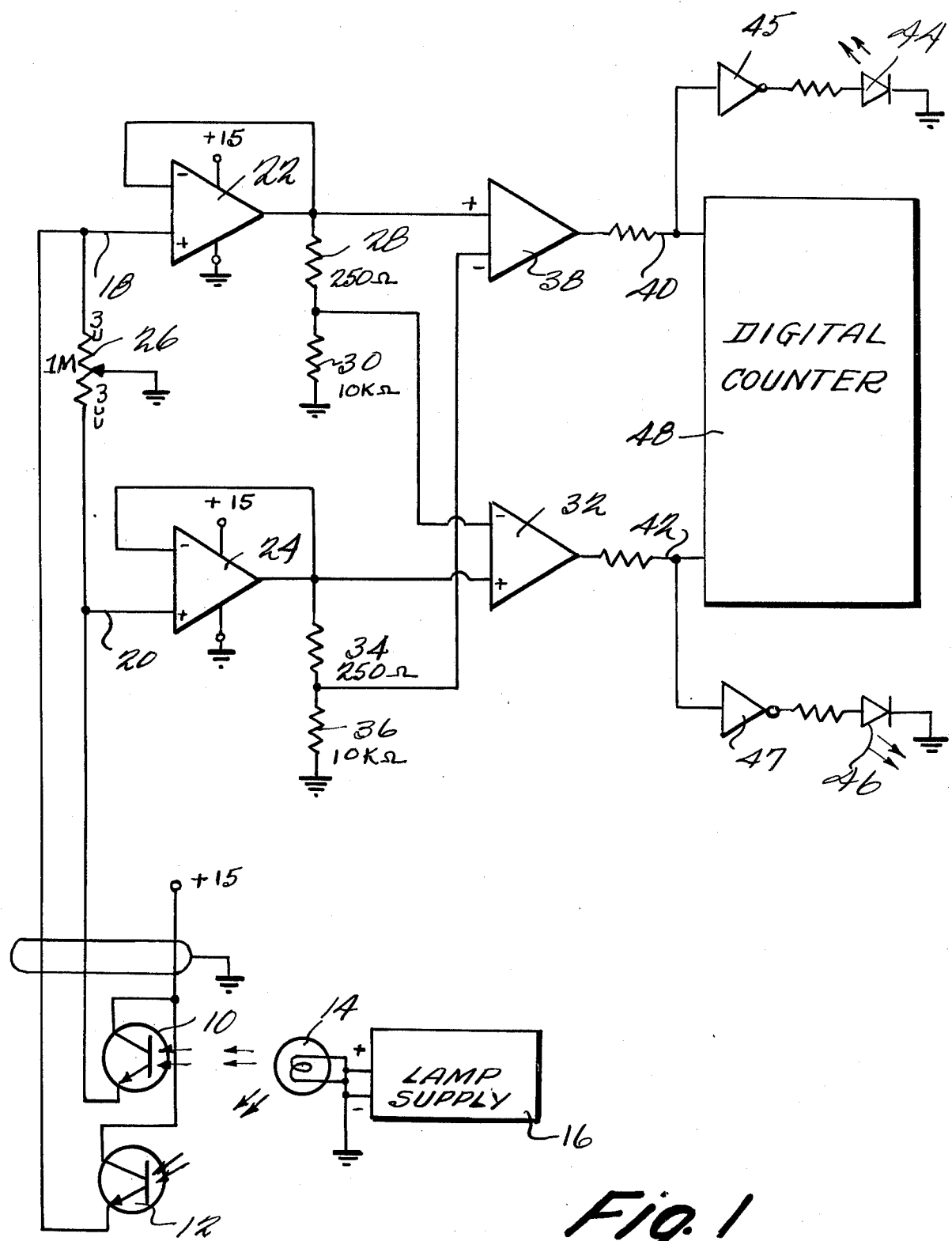
FIG. 1 shows a schematic circuit of the present invention particularly useful for detecting breakage of thread or yarn strands.
Figure 2:
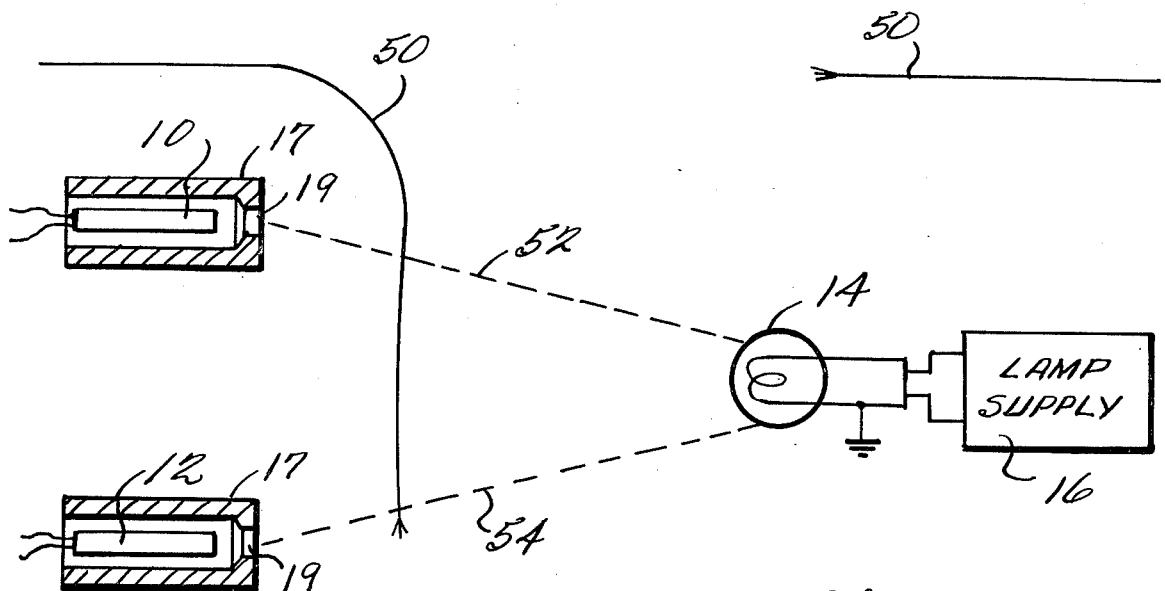
FIG. 2 shows a schematic arrangement of two sensors for providing the input signals to the circuit of FIG. 1.

Reference is now made to FIGS. 1 and 2 which illustrate a first embodiment of the present invention. Conventional photoresistive transistors 10 and 12 are connected as shown to a voltage source and receive light from a lamp 14 which is supplied with a suitable voltage by a conventional supply 16. The emitters of transistors 10 and 12, respectively, are connected via a shielded cabe to the positive inputs 18 and 20 of operational amplifiers 22 and 24. A balancing resistor 26 is also connected between the inputs with its center tap grounded for balancing the voltages from phototransistors 10 and 12.

The negative inputs to operational amplifiers 22 and 24 are connected to the outputs in conventional fashion to form voltage follower circuits. Thus, operational amplifiers 22 and 24 have unity gain and provide low output impedance and high input impedance. The output of operational amplifier 22 is directly connected to the positive input (non-inverting) to a first voltage comparator 38. Amplifier 22 also is connected to a voltage divider circuit comprising resistors 28 and 30 to apply a given percentage, as determined by the respective values of resistors 28 and 30, of its output to the negative input (inverting) to a second voltage comparator 32. The output of operational amplifier 24 is directly connected to the positive input to the comparator 32. Similarly, the output of operational amplifier 24 is divided by resistors 34 and 36 to produce a reduced voltage which is applied to the negative input to comparator 38. Thus, the circuit of FIG. 1 has two inputs and two outputs. Under normal conditions, the outputs 40 and 42 of comparators 38 and 32 will be the power supply voltage of +15 volts.

Let us assume now a reduction in current through transistor 10 resulting from a reduction in the incident light. This reduction in current reduces the voltage at the input 20 to operational amplifier 24. The output of operational amplifier 24 is similarly reduced which reduces the positive input to the comparator 32. If the voltage falls below the voltage supplied by resistors 28 and 30 to the negative input to comparator 32, the output 42 of comparator 32 will drop to zero, thus providing a clear indication that the current through photoresistor 10 has dropped below a predetermined value. Similarly, should the current through photoresistive transistor 12 fall by more than a given percentage so that the negative input provided by the divided output of operational amplifier 24 is greater than the positive input provided by operational amplifier 22, then the output 40 of comparator 38 will fall to zero providing a second readily ascertainable signal. Outputs 40 and 42 are connected via interface circuitry (not shown) to a conventional digital counter 48 and are also connected to light emitting diodes 44 and 46 via inverters 45 and 47, the diodes being momentarily lighted when the respective outputs 40 and 42 drop to zero. The outputs 40 and 42 can be similarly processed and fed to a power relay to shutoff production machinery.

FIG. 2 illustrates how the arrangement of FIG. 1 can be used with particular effectiveness to detect a broken strand. Strand 40 when it breaks is arranged to fall so as to sequentially intercept the path 52 between source 14 and the phototransistor 10 and the path 54 between source 14 and phototransistor 12. Each phototransistor is mounted in a mechanical light shielding structure comprised of a hollow aluminum rod or housing 17 having a light admitting aperture 19 at one end aligned with the filament of lamp 14. Preferably, the longitudinal axis of the light filament is also aligned parallel to the axes of the strands to be detected. The sensitivity of the device can be further increased by mounting a focusing lens in the aperture 19 to yield an optimum filament image. In setting up the device for operation as a thread detector, the balancing resistor 26 is adjusted midway between the resistive positions at which the diodes 44 and 46 are first lighted, diode 46 being actuated by increasing resistance at the input to amplifier 22 and diode 44 being actuated by increasing resistance at amplifier 24.

Figure 3:
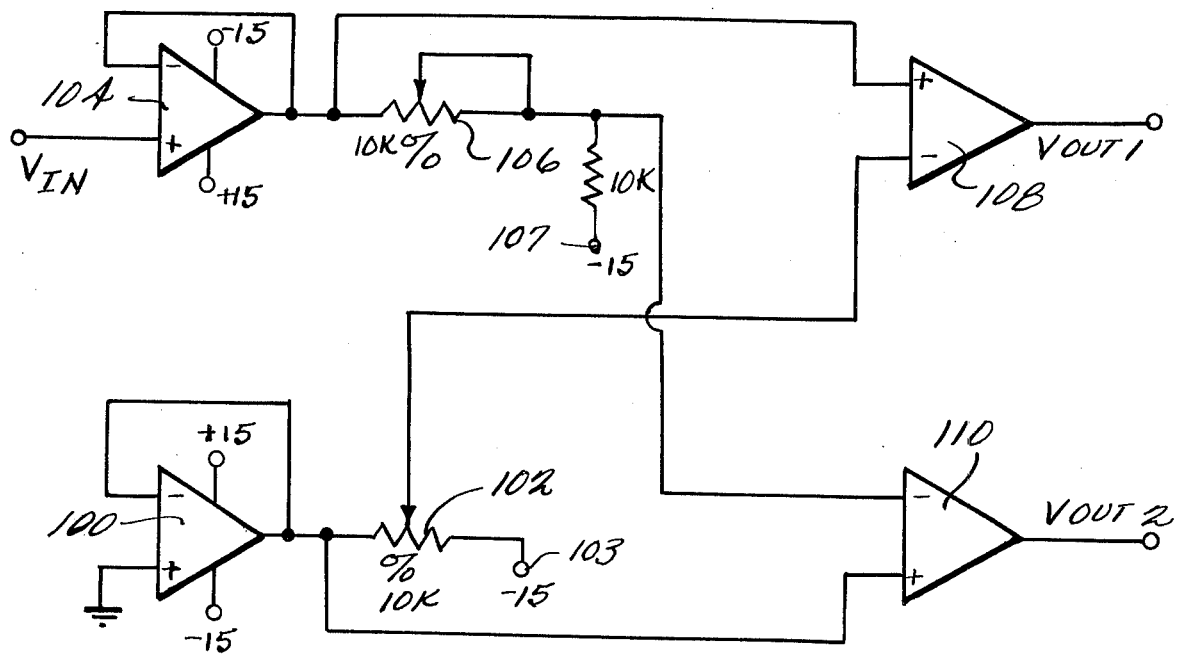
FIG. 3 shows a second embodiment of the present invention which is particularly useful for detecting fluctuations of an input voltage with respect to a reference.

Reference is now made to FIG. 3 which illustrates a second embodiment of the invention which is particularly useful whenever voltage fluctuations are to be ascertained at a preset percentage of difference on either side of a reference voltage. In this arrangement, the input to operational amplifier 100 is grounded to provide a ready reference. The output of operational amplifier 100 is divided by a variable potentiometer 102 and the output of amplifier 104 by a variable potentiometer 106 with the voltages connected to comparators 108 and 110 which produce output voltages in the same fashion as described above. Thus, the percentage variation of voltage "V IN" relative to ground required to produce the output signals "V out 1" and "V out 2" can be directly set on the variable resistances 102 and 106. The voltage applied at terminals 103 and 107 determine the operational range of the input voltage "V IN". Thus, if −6 volts is applied to those terminals instead of the −15 volts shown, the operational range of "V IN" would be from −6 volts to +6 volts.

By reversing the positive and negative inputs to the comparators, the outputs of either embodiment can be inverted and similarly utilized. The two outputs are preferably processed by a simple logic circuit, such as flip-flop circuitry with appropriate gates and inverters, to produce a single control function in response to sequential changes in the comparator outputs. Although operational amplifiers can be used as voltage comparators other voltage comparator circuits are available which have better response and gain characteristics and those are preferred. For example, a suitable circuit is the LM139 series of voltage comparator available from National Semiconductor Corporation and described in Radio Shack Catalog No. 62-1372.

The present invention can be used in a variety of different applications. For example, by employing the photo-resistive components as a movable member or wand arranged to pass transversely across a warp of threads running between the wand and a reflective backing or mirror, the number of individual threads in the warp can be counted with perfect accuracy. The sensitivity and resolution of the device depicted in FIGS. 1 and 2 is so great that it can differentiate between and detect threads as small as 2 mils in diameter at a lamp to sensor distance of up to 6 feet. Other applications include alarm systems, remote monitoring systems, limit comparators, temperature controllers, over and under voltage protection devices, electronic counters, trigger circuits, frequency doublers, and the like. The basic circuit can be varied considerably to include gain networks, shaping networks, offset adjustment networks and transistor equivalent circuits without circumventing the unique and novel features of the present invention. Accordingly, the scope of the invention is intended to be limited only by the scope of the appended claims.

What is claimed is:

1. A circuit for providing a first given output signal at a first output when an input signal at a first input exceeds an input signal at a second input by a predetermined magnitude and a second given output signal at a second output when an input signal at said second input exceeds an input signal at said first input by a predetermined magnitude comprising:

a first operational amplifier having first and second inputs and an output with one input thereof comprising said first input of said circuit and the other input connected to the output thereof, a second operational amplifier having first and second inputs and an output with one input thereof comprising said second input of said circuit and the other input connected to the output thereof, a first comparator having first and second inputs and an output for producing a signal at the output thereof which is a function of the difference between the input signals, said first comparator having its first input connected to the output of said first amplifier, a second comparator having first and second inputs and an output for producing a signal at the output thereof which is a function of the difference between the input signals, said second comparator having its first input connected to the output of said second amplifier, first resistance means connected to the output of said first amplifier and to the second input to said second comparator for dividing the output of said first amplifier and applying a signal reduced in magnitude to the second input to said second comparator, and second resistance means connected to the output of said second amplifier and to the second input to said first comparator for dividing the output of said second amplifier and applying a signal reduced in magnitude to the second input to said first comparator.

2. A circuit as in claim 1 wherein said first and second resistance means are variable.

3. A circuit as in claim 1 wherein said comparators are each operational amplifiers with the positive input being said first input and the negative input being said second input.

4. A system for detecting passage of a light varying object comprising:

a first photoresistor sensor for producing a voltage signal when the incident light thereon varies, a second photoresistor sensor for producing a voltage signal when the incident light thereon varies, a light source, means for mounting said first and second sensors and said source so that light from said source is incident upon said first and second sensors and said object passes between said sensors and source to in sequence break the path between said first sensor and source and then the path between said second sensor and source to cause said first and second sensors to sequentially produce said voltage signals, a first operational amplifier having first and second inputs and an output with one input thereof connected to said first sensor and the other input connected to the output thereof, a second operational amplifier having first and second inputs and an output with one input thereof connected to said second sensor and the other input connected to the output thereof, a first comparator having first and second inputs and an output for producing a signal at the output thereof which is a function of the difference between the input signals, said first comparator having its first input connected to the output of said first amplifier, a second comparator having first and second inputs and an output for producing a signal at the output thereof which is a function of the difference between the input signals, said second comparator having its first input connected to the output of said second amplifier, first resistance means connected to the output of said first amplifier and to the second input to said second comparator for dividing the output of said first amplifier and applying a signal reduced in magnitude to the second input to said second comparator, and second resistance means connected to the output of said second amplifier and to the second input to said first comparator for dividing the output of said second amplifier and applying a signal reduced in magnitude to the second input to said first comparator.

* * * * *